United States Patent
Taylor

(10) Patent No.: US 7,415,689 B2
(45) Date of Patent: Aug. 19, 2008

(54) AUTOMATIC CONFIGURATION OF A MICROPROCESSOR INFLUENCED BY AN INPUT PROGRAM

(75) Inventor: Richard Michael Taylor, Midlothian (GB)

(73) Assignee: Critical Blue Ltd., Edinburgh (GB)

( * ) Notice: Subject to any disclaimer, the term of this patent is extended or adjusted under 35 U.S.C. 154(b) by 426 days.

(21) Appl. No.: 10/518,991

(22) PCT Filed: Jun. 30, 2003

(86) PCT No.: PCT/GB03/02784

§ 371 (c)(1), (2), (4) Date: Dec. 21, 2004

(87) PCT Pub. No.: WO2004/003776

PCT Pub. Date: Jan. 8, 2004

(65) Prior Publication Data

US 2005/0251647 A1 Nov. 10, 2005

(30) Foreign Application Priority Data

Jun. 28, 2002 (GB) ................................. 0215034.0

(51) Int. Cl.
 *G06F 17/50* (2006.01)
(52) U.S. Cl. .......................................... 716/16; 716/18
(58) Field of Classification Search ............... 716/16, 716/18; 712/10–18, 32–33, 201
See application file for complete search history.

(56) References Cited

U.S. PATENT DOCUMENTS

| | | | |
|---|---|---|---|
| 6,408,428 B1 | 6/2002 | Snider et al. | |
| 6,986,021 B2 * | 1/2006 | Master et al. | 712/15 |
| 7,036,106 B1 * | 4/2006 | Wang et al. | 716/18 |
| 7,225,319 B2 * | 5/2007 | Campi et al. | 712/1 |
| 2002/0188923 A1 * | 12/2002 | Ohnishi | 716/18 |
| 2003/0163668 A1 * | 8/2003 | Mirsky et al. | 712/15 |
| 2005/0091472 A1 * | 4/2005 | Master et al. | 712/15 |
| 2006/0031660 A1 * | 2/2006 | Master et al. | 712/15 |
| 2006/0259878 A1 * | 11/2006 | Killian et al. | 716/1 |

OTHER PUBLICATIONS

P. Hamalainen; M. Hannikainen; T. Hamalainen; H. Corporaal and J. Saarinen; "Implementation of Encryption Algorithms on Transport Triggered Architectures"; 2001 IEEE O-7803-6685-09/01 pp. IV 726-IV 729.

Zhining Huang; Sharad Malid; Electrical Engineering Department, Princeton University; "Managing Dynamic Reconfiguration Overhead in Systems-on-a-Chip Design Using Reconfigurable Datapaths and Optimized Interconnection Networks"; IEEE Computer Society; 2001.

Seppo Virtanen; Johan Lilius; "The TACO Protocol Processor Simulation Environment" Turku Centre for Computer Science; 2001.

* cited by examiner

*Primary Examiner*—Stacy A Whitmore
(74) *Attorney, Agent, or Firm*—Mark D. Simpson; Saul Ewing LLP

(57) ABSTRACT

An automatic process for configuring a microprocessor architecture that consists of a number of execution units with configurable connectivity between them. The data and control flows within an input program are used to influence the process so that the resulting microprocessor is able to efficiently exploit parallelism available within the input program.

36 Claims, 12 Drawing Sheets

Diagrams

Figure 9

```
int sample[1040];       // input samples
int output[1024];       // filtered output samples
int coeff[16];          // filter coefficients
int i, *j, *k, sum;     // temporary variables
...
for (i = 0; i < 1024; i++) {
  sum = 0;
  for (j = &sample[i], k = &coeff[0]; k < &coeff[16]; j++; k++) {
    sum += (*j) * (*k);
  }
  output[i] = sum >> 16;    // shift to take account of fixed point
}
```

Figure 10

```
INNER_LOOP:

LDR    r7,[r1],#4          ——— 1001

LDR    r8,[r0],#4          ——— 1002

CMP    r0,r14              ——— 1003

MLA    r2,r8,r7,r2         ——— 1004

BCC    INNER_LOOP          ——— 1005
```

→ 1106
→ 1107
---▶ 1108

| Results\Operands | Arithmetic | Immediate | Memory | Multiply | Reg File |
|---|---|---|---|---|---|
| Arithmetic (Op1) | 1 | 0 | 1 | 1 | 2 |
| Arithmetic (Op2) | 0 | 0 | 1 | 0 | 2 |
| Branch | 0 | 0 | 0 | 0 | 0 |
| Memory | 0 | 0 | 0 | 0 | 2 |
| Multiply (Op1) | 0 | 1 | 0 | 0 | 0 |
| Multiply (Op2) | 0 | 1 | 0 | 0 | 0 |
| Reg File | 3 | 0 | 0 | 0 | 0 |
| Squash | 1 | 0 | 0 | 0 | 0 |

AUTOMATIC CONFIGURATION OF A MICROPROCESSOR INFLUENCED BY AN INPUT PROGRAM

CROSS REFERENCE TO RELATED APPLICATIONS

This application claims the priority of PCT/GB03/002784 filed Jun. 30, 2003 and British Application GB 0215034.0 filed on Jun. 28, 2002, the contents of which are hereby incorporated by reference.

TECHNICAL FIELD

The present invention is in the field of digital computing systems. In particular, it relates to a method of automatically configuring a microprocessor architecture.

BACKGROUND ART

The typical nature of general purpose processor architectures is that the Instruction Set Architecture (ISA) is fixed. This means that the types of operations supported and thus the presence of appropriate functional units is also fixed. The unit mix is determined during the processor design time upon the basis of a wide range of applications.

In an embedded application the microprocessor may spend a significant proportion of its time executing a small kernel of tasks. If the processor architecture could be modified to fit the requirements of those key tasks more closely then higher levels of performance could potentially be achieved. This is clearly desirable in the context of embedded systems where design time is crucial and there is a strong desire to keep as much functionality in software as possible, for reasons of both flexibility and development time. A custom hardware solution is more desirable from the perspective of performance but the design time and costs tend to be much greater.

Configurable RISC processors attempt to bridge that gap by providing a manual means to extend the instruction set of a processor. Hardware can be designed that is integrated into the data and control paths of the processor so that the hardware can be accessed in the form of an additional instruction. The disadvantage of this approach is that it is manual and the ultimate performance gains that can be achieved are significantly limited by the architecture of the underlying processor itself.

Recent work has focused on providing automatic means to identify clusters of frequently occurring operations and automatically form them into a single, more efficient, instruction. This increases the level of automation but is still limited by the underlying processor architecture.

A more general solution involves the use of a more scalable underlying processor architecture. This provides more opportunities for parallel execution resources in the architecture and underlying connectivity that dosely reflects the requirements of the application. The most relevant academic prior art is that for the automatic synthesis of TTAs (Transport Triggered Architectures). In this approach the starting point is a fully connected TTA with a number of duplicated functional units. The least used connections and least used functional units are gradually removed to produce a more optimised architecture. The performance of the architecture versus its silicon area can be graphed.

SUMMARY OF INVENTION

If an application specific processor is being synthesized then far greater efficiency can be obtained by determining the functional unit and connectivity resources on the basis of the particular application it is to be used for. The mix must be determined automatically by analyzing the type of code that the processor is going to execute. It is not sufficient to just measure the frequency of usage of different operations and replicate units on that basis. There is no advantage to be gained unless there are situations in which a number of replicated functional units could be usefully used in parallel. The optimisation must perform detailed analysis of the data flows within the program (especially the most performance critical parts) and use that to determine the right number of, and connectivity for, the functional units.

An initial candidate architecture is created with a minimal connectivity network and one copy of each functional unit. Software code is then targeted at the candidate architecture. As such code is being generated, information is collected about resources that could be used to improve the code generation. For instance, a count is kept of the number of occasions in which data needs to be transported between two functional units, and there is not a direct connection between. A count is also maintained of the number of times that all functional units of a particular type are busy with existing operations when another operation of that type needs to be performed.

The counts produced during code generation are then weighted by two different factors. Firstly, code from the software functions that have been marked as being critical for overall performance are given a higher weighting. Instructions within the inner loops of such functions are given a still higher weighting. The weightings are used direct the allocation of new resources.

A new resource might be a duplicate functional unit or a new connection between functional units. The area overhead of the new resource is compared against its weight in comparison to other potential resource additions. A choice is made for a new resource taking into account both the area it occupies and its potential benefit. When a new resource has been added to the architecture the code generation process is repeated. The addition of the resource should improve the performance of the architecture and also reveal what further resources should be added.

A graph of estimated performance versus area for each candidate architecture is produced. The user is able to pick any architecture that has been produced and fix that as the final architecture for the system. In this way the architecture is tuned to the particular requirements of the application.

BRIEF DESCRIPTION OF DRAWINGS

FIG. 9 shows some C source code to implement a FIR filter.

FIG. 10 shows the code compiled to ARM machine instructions.

DESCRIPTION OF PRESENTLY PREFERRED EMBODIMENT

Architectural Overview

This disclosure describes a method for automatically generating a microprocessor architecture that is customised for a particular application. The architectural synthesis process is directed by an input software application. This software is analysed and a suitable architecture constructed. This architecture is designed to exploit parallelism that can be extracted from the code.

The synthesis utilises a highly configurable and scalable underlying hardware architecture. This is formed from a grid of interconnected functional units. Each functional unit is able to perform a basic operation. It reads a number of operands on a given dock cycle and generates a number of results a certain number of dock cycles later. The operation of the functional units is directly controlled by the instruction set of the microprocessor. The number of functional units, their type and the connections between them is fully configurable.

Figure 2:
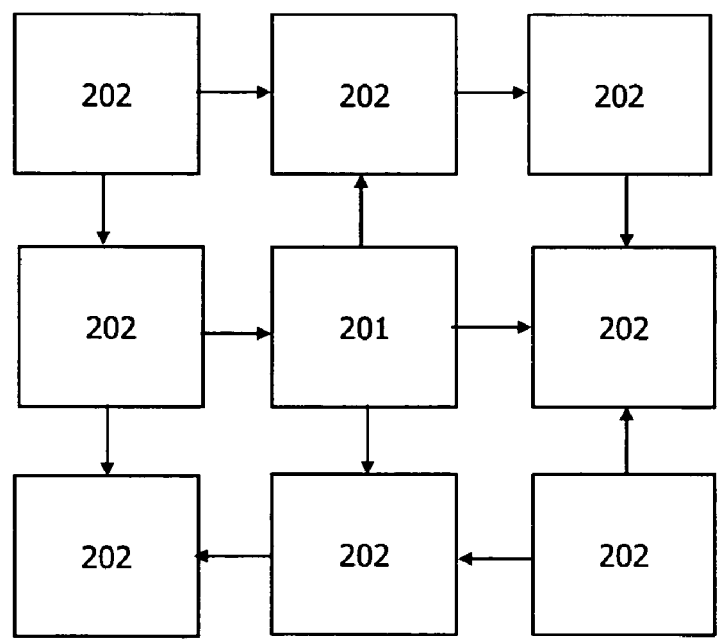
FIG. 2 illustrates an example layout of functional units in a two-dimensional grid.

An example functional unit array is shown in FIG. 2. Given physical connectivity limitations of the functional unit array, not every unit is connected to every other. Thus in some circumstances a data item may be generated by one unit and needs to be transported to another unit with which there is no direct connection. The placement of the units and the connections between them is specifically designed to minimise the number of occasions on which this occurs. The interconnection network is optimised for the data flow that is characteristic of the required application code. A register file unit 201 is placed centrally. Other functional units 202 are placed around the register file as required by the application software code.

To allow the indirect transport of data items, certain functional units may act as a repeater. That is, it may select one of its operands and simply copy it to its output without any modification of the data. Thus a particular value may be transmitted to any operand of a particular unit by using functional units in repeater mode. A number of individual "hops" between functional units may have to be made to reach a particular destination. Moreover, there may be several routes to the same destination. The code mapper selects the most appropriate route depending upon other operations being performed in parallel. The code mapper is responsible for transforming an input program into a sequence of operations that can be performed on a given configured microprocessor.

A single functional unit may have multiple output registers. Each of these may be connected to different functional unit or functional unit operand. The output registers that are overwritten by a new result from a functional unit are programmed as part of the instruction word. This allows the functional unit to be utilised even if the value from a particular output register has yet to be used. It would be highly inefficient to leave an entire functional unit idle just to preserve the result registered on its output. In effect each functional unit has a small, dedicated, output register file associated with it to preserve its results.

There are underlying rules that govern how functional units can be connected together. Local connections are primarily driven by predominate data flows between the units. Higher level rules ensure that all operands and results in the functional unit array are fully reachable. That is, any result can reach any operand via a path through the array using units as repeaters. These rules ensure that any code sequence involving the functional units can be generated. The performance of the code generated will obviously depend on how well the data flows match the general characteristics of the application. Code that represents a poor match will require much more use of repeating through the array.

The preferred embodiment uses a distributed register file. The main register file does not form a central bottleneck that would severely hamper the scalability of the architecture. The majority of communication in the architecture occurs directly between functional units without a requirement to use the central register file. Small blocks of registers local to each functional unit hold data values until they are required by subsequent operations. The connections between the functional units and their placement are optimised synergistically to adapt to the data flow present in the application.

A structural Hardware Description Language (HDL) representation of the processor is generated from architectural synthesis process. A further architecture description is generated to allow code generation to be subsequently targeted at the architecture. The HDL description instantiates all the functional units required and the connectivity between them. Each functional unit library element references its hardware description, allowing the HDL to instantiate the units as required.

Functional Units

Figure 1:
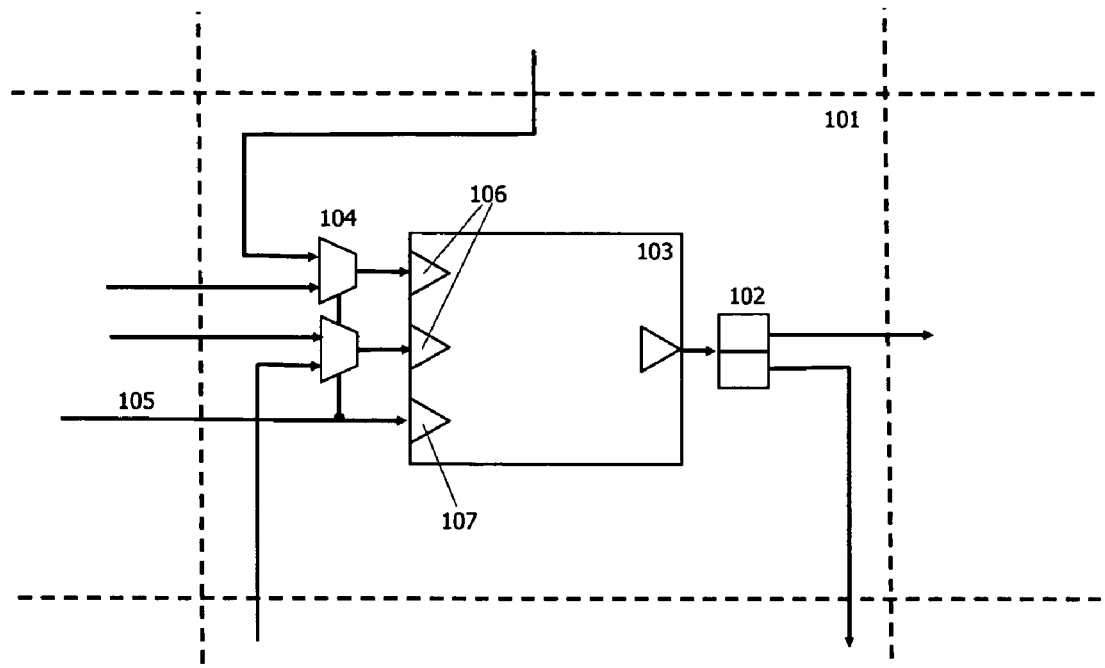
FIG. 1 illustrates example connectivity of a functional unit in a processor including input operands and output registers.

The basic architecture of functional unit is shown in FIG. 1. The central core of a functional unit 101 is the execution unit itself 103. It performs the particular operation for the unit. The preferred embodiment automatically instantiate the required hardware blocks around the execution unit in order to form a functional unit. These blocks allow the functional unit to connect to other units and to allow the unit to be controlled from the execution word.

Functional units are placed within a virtual array arrangement. Individual functional units can only communicate with near neighbours within this array. This spatial layout prevents the architectural synthesis generating excessively long interconnects between units that would significantly degrade the maximum clock frequency.

Each operand input 106 to the execution unit may be chosen from one of a number of potential data buses using multiplexers 104. In some circumstances the operand may be fixed to a certain bus, removing the requirement for a multiplexer. The number of selectable sources and the choice of particular source buses are under the control of the architectural synthesis process.

All results from an execution unit are held in independent output registers 102. These drive data on point-to-point buses connected to other functional units. The point-to-point nature of these buses minimises power dissipation and propagation delays. Data is passed from one functional unit to another in this manner. The output register holds the same data until a new operation is performed on the functional unit that explicitly overwrites the register.

Bits from the execution word 105 control the operand multiplexers and provide the method to the execution unit 107.

Architecture Generation

The tools must create connections between execution units in response to the data flow in the application. The network must be a good fit for the application but still retain sufficient connectivity so that the processor is still able to execute general purpose code without crippling inefficiency. The optimisation problem may be further constrained by total area requirements or a limit on the number of inputs or outputs for a single operand multiplexer.

The goal of the optimisation is to produce an architecture that is minimal, but sufficient. The overall utilisation of the connections and execution units in the application must be very high. Unnecessary connections add a cost burden to the processor.

There is a strong synergy between the code mapper and architectural synthesis optimisations. These two problems should not be considered in isolation. If the architectural synthesis produces a good architecture it is of no use if the code mapper is unable to make efficient use of it. Equally, there is no point in producing good mappings for a fundamentally bad architecture. The preferred embodiment intimately ties these two optimisation problems together to avoid these types of mismatches.

The basic approach employed for is to generate trial mappings on candidate architectures. An initial trial architecture is produced with the functional units as specified by the user. A minimal connectivity network between functional units is also generated. This is a minimal architecture that will be optimised by adding customised connections.

The effectiveness of a particular architecture is measured using attributes of the mapped code. These include the estimated execution time for particular code blocks and average utilization of processor resources. The user supplies a list of functions that are critical to the overall performance of the application. A weight can be annotated for each function to show its contribution to the overall execution time. The functions can be identified and proportions determined by using profiling tools. Profiling tools are used to capture the dynamic behaviour of a particular software application. For a particular trial architecture the overall architectural fitness calculation is then made on the basis of generated code efficiency weighted by its importance to overall application performance.

When the code mapper is operating during architectural optimisation it maintains information about new connections that might be added. When trying to transport data between operations it tries to use the most direct routes. If those connections do not exist in the architecture then it adds a request to add them. It then looks at less favourable routes, that may take longer, until it finds a usable route. At each stage requests are made to add new connections. These connection requests are driven directly by the flow of data in the user's application. The weighting of the request is dependent upon the criticality of the node and the importance of the function to which it belongs. The weighting system automatically concentrates the optimisations onto the most important data paths in the application.

When the code mapping for the application is complete the connection requests are examined. The most requested connection may then be added to the architecture. There are restrictions on the maximum fan-in and fan-out for a particular operand or result port for a functional unit. Once the limit has been reached no new connections may be added. In that case the second most requested connection is added, and so on. Once a new connection is actually made, all the code is mapped again. The existence of the connection should improve the code sequences produced.

Information is also generated showing the utilisation of particular functional units, both on an overall basis and within particular functions. The user can then assess whether there would be a benefit to adding another copy of a particular functional unit. If there are multiple versions of a particular functional unit then the code scheduler automatically balances code across them.

As new connections are added the architecture is being specialised to the application. Clusters of individual functional units in a fixed pipeline, can become an emergent property of the architectural synthesis. What is produced is a hybrid of a general purpose and specialised connection architecture, as directed by the function weightings.

Information about each trial architecture is produced for the user. This includes an estimate of its area, its code density and estimates of its performance on particular functions and overall. The user can then choose any of the trial architectures for actually synthesis into a real processor. Thus the user can trade off area and performance as required for their particular application.

Interconnect Philosophy

One of the key goals of the architectural synthesis is to optimise the interconnections between the functional units. A traditional architecture fully connects all the functional units in the processor via the central register file and various bypass buses. This does not provide a suitably scalable architecture for generated processors.

The connections between individual functional units are customized depending upon the characteristics of the data flow for a particular application. If the results of one functional unit are never, or only rarely, used by another unit then there is little value in having a direct connection between them. The number of possible connections grows as a square of the number of functional units and each one occupies area. Also, as the number of connections to a particular operand grows the input multiplexer becomes slower, degrading the maximum clock frequency for the system.

Each functional unit has a number of operand inputs and outputs. The output values are held in output registers. Each output drives a single source and single sink bus that is connected to an input of one other functional unit.

Architecture Synthesis Steps

Figure 3:
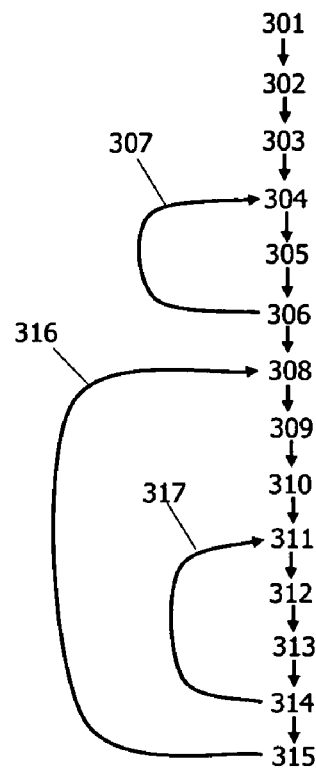
FIG. 3 shows the flow of steps involved in the architecture generation process.

FIG. 3 shows the flow of individual optimisation steps for the architectural synthesis process. This flow assumes an input of executable code but the steps are representative of the final steps within a complete compilation process from a high level language.

The first step 301 performs a control flow analysis on the functions that are to be mapped to the processor. Step 302 then performs a liveness analysis on the registers used in the functions to be mapped. Step 303 performs a translation of the code into a graph representation of atomic operations. At this stage the code will also be subdivided into regions that can be treated separately.

The next steps iterate 307 over the regions that have been identified. The first step 304 performs an access analysis to map certain memory access operations onto certain physical hardware units in order to improve efficiency. Step 305 performs optimizations on the code to reduce the number of uses of the central register file. Where possible, data is directly transported between functional units. The optimizations assume that there are no restrictions in terms of connectivity between functional units. Finally step 306 captures quantative data flow information about the transfer of data between particular functional units in the system (assuming an idealized set of communication resources). This is subsequently used to drive the functional unit placement process.

The next steps iterate 316 over a set of functional units being added to the architecture. The architecture initially has a minimal set of functional unit resources. Addition units are added to determine the impact on performance and thus provide a trade-off between area and performance. Step 308 performs a unit placement that is aware of the communication characteristics of the individual units and seeks to minimize the separation in the virtual array grid of units that frequently communicate. Step 309 adds the key local connectivity between frequently communicating units. Step 310 performs a reachability analysis on the architecture. This ensures that there is sufficient connectivity that new code can be mapped to the architecture even after the hardware has been fixed.

The next set of steps iterate 317 over the addition of new connections to the architecture. This iteration is within the outer iteration over the number of functional units. Step 311 generates an execution word layout for the processor. This determines how individual functional units are controlled from the word. This must be updated as new connections are added as that changes the widths of the control bits for certain functional units. Step 312 performs a fitness measurement of the mapping of the code onto the candidate architecture. In the preferred embodiment this performs the code mapping onto the candidate and measures fitness from the weighted schedule lengths. This technique has the advantage that it guarantees that the fitness reflects the actual performance that can be achieved automatically from the candidate. Step 313 saves the candidate architecture if it has better characteristics than previous architectures that have been generated. Saved architectures may be subsequently analyzed in order to find the one most suitable for the purpose. Step 314 adds one or more new connections into the architecture on the basis of characteristics of the code mapping process. In particular connections are added that are likely to reduce the lengths of the schedules that are generated. Once new connections have been added the process is repeated from the execution word creation 311. When a certain threshold of new connection addition is reached then additional functional units may be added.

Step 315 adds a new functional unit that is most likely to improve parallelism and thus reduce the schedule lengths in code mapping with a resultant improvement in performance. Once a new functional unit is added the process is repeated from unit placement 308 with the new set of functional units. This process stops when the maximum area or other constraint has been reached.

Architecture Synthesis Output

The output of the architectural optimisation process is a series of candidate architectures with particular performance characteristics. The configuration information for each of the architectures is stored and the user can then select any individual architecture that most closely matches the required area and performance for the application.

Figure 4:
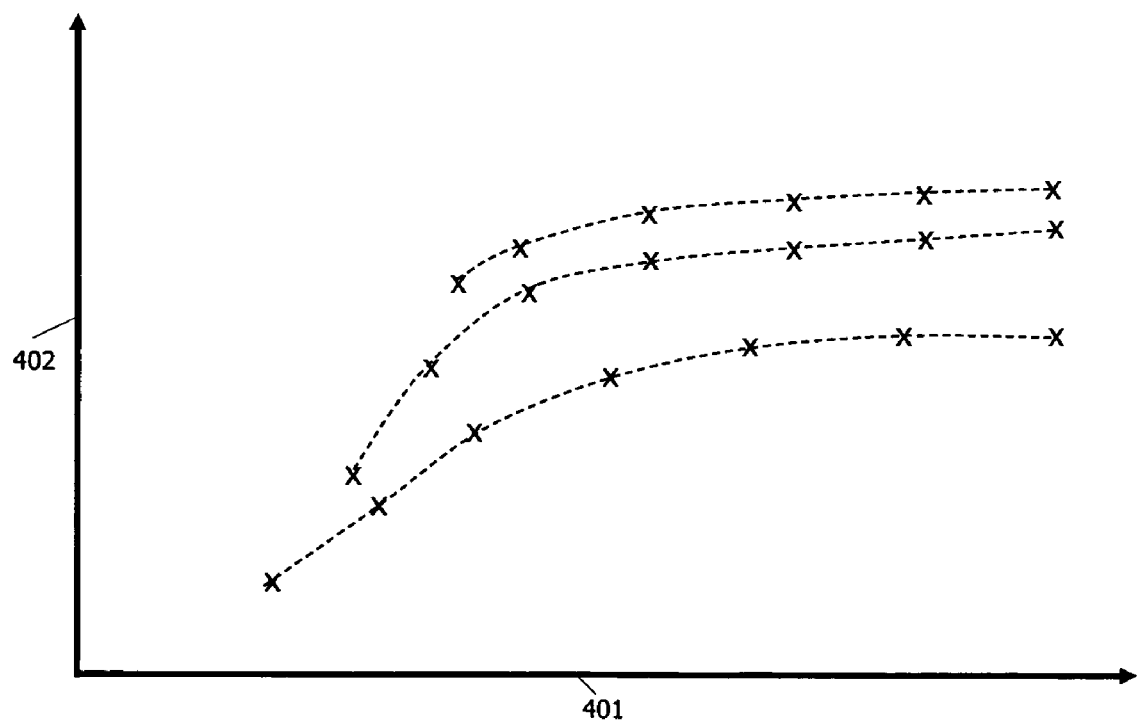
FIG. 4 shows an example of the candidate performance graph constructed as a result of the generation of architectures.

In the preferred embodiment, the output is in the form of a graph representation. An idealised representation of the graph is shown in FIG. 4. The graph shows the estimated performance 402 versus area requirements 401 for all the candidate architectures tested. Each cross on the diagram represents such a candidate architecture. A dashed line in the diagram joins all the candidates that are constructed from the same set of functional units. Each candidate has a different number of additional connections added.

In general the shape of the curves produced will be similar to those on the diagram. An initial architecture can be improved by the addition of new connections but ultimately there is a law of diminishing returns as new connections are added. In reality the curves produced will not be nearly as smooth as particular idiosyncrasies of particular architectural configurations will produce a noise level on the general improvement of the architecture as new connections are added.

As illustrated on the diagram the disadvantage of architectures with greater numbers of functional units is that the area becomes larger. In general, however, the average performance should be better presuming that the parallelism afforded by the additional functional units can be efficiently utilised.

The area is estimated by the addition of the area of all the functional units employed. A definition for each functional unit has an attribute of the amount of area occupied for a particular target technology. Additional area is also estimated for the connections between the functional units. Heuristics are used related to the target technology and the number and width of connections.

The estimated performance is based on a weighted representation of the number of dock cycles to implement the critical functions within the application. The number of dock cycles is obtained by mapping code for the critical functions to run on the candidate architecture. The library blocks and connectivity rules are constructed so that the architecture is designed to run at a particular dock frequency for a particular target technology. Thus the clock speed multiplier is designed to be a constant for all candidate architectures generated.

The following sections describe specific steps in the architectural synthesis process in more detail:

Idealised Graph Construction (Step 305)

In the preferred embodiment, the first step is to produce an idealised Control and Data Flow Graph (CDFG) for the region. Such a CDFG ignores the creation of register file read and write operations to maintain correct state within the registers. This allows the actual data flow between operations to be measured.

Quantative Dataflow Calculation (Step 306)

The purpose of the quantative dataflow estimation is to generate a table of the data flow between all the functional units in the architecture. Initially the functional units will be the minimal set but will be expanded as additional functional units are added to the candidate architecture. A translation of the source instructions and creation of a CDFG is required for this phase in order to measure the data flow. The quantative data flow estimation allows decisions about the initial placement of the functional units and the basic connections between them to be made.

Each of the arcs in the CDFG is examined and its impact is recorded in the quantative dataflow matrix. Entries are weighted depending upon the criticality of the function from which the region is obtained and the loop nesting level. The cummulative matrix produced after visiting all regions represents the overall flow of data between functional units within the system. This step also maintains a frequency of use count for each of the functional units in the system. This is used to order their placement in the processor array.

Unit Placement (Step 308)

The units in the processor are placed in a virtual array. This phase only places the units, while connections between them are added during the following phases.

The placement occurs in a virtual grid with the first unit placed in the middle of the grid. Placement is driven from an idealized representation of the code. In this form it is assumed that all execution units are able to communicate directly. The quantative dataflow is used to drive the process. When possible, units that frequently communicate a placed close to one another on the array.

In the preferred embodiment, placement starts with the register file. This is chosen because it is a key unit and the amount of communication it requires with other units will be under-represented due to the idealised assumptions made during the CDFG optimisations. Thus placing the unit at the centre increases the opportunities to add additional connections to it later in the connectivity optimisation.

The remaining functional units are placed on the basis of decreasing weighted frequency of use. Thus the placement aims to place the most frequently used units near the centre of the virtual array and the less frequently used units on the periphery.

Figure 5:
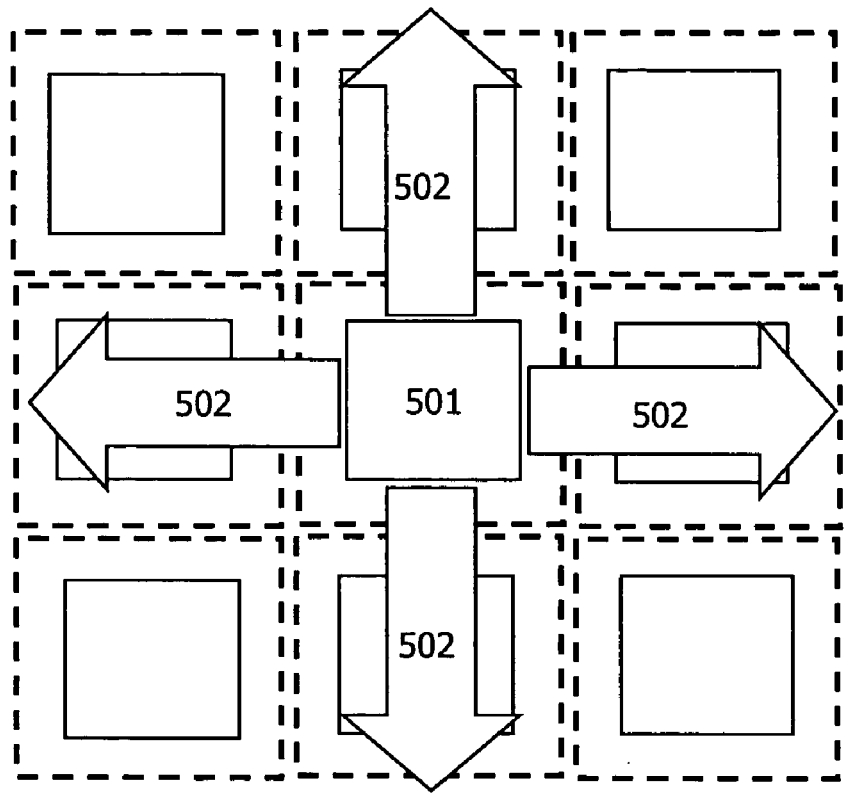
FIG. 5 shows the placement of the register file unit at the centre of the two-dimensional grid and the placement of other units spreading from the centre.

FIG. 5 shows the expansion of the unit placement on the basis of decreasing frequency of use. The register file 501 is placed centrally. Other units are placed in order of decreasing frequency 502 such that the least used units are on the periphery of the array. The actual positioning a placement is dependent on the communication requirements of the unit. Each free slot on the boundary of the virtual array is considered as a candidate. Newly placed units will tend to be placed dose to units with which they have high communication. This also means that there is a higher chance that a direct connection could be added during the connectivity optimisation stage.

Figure 6:
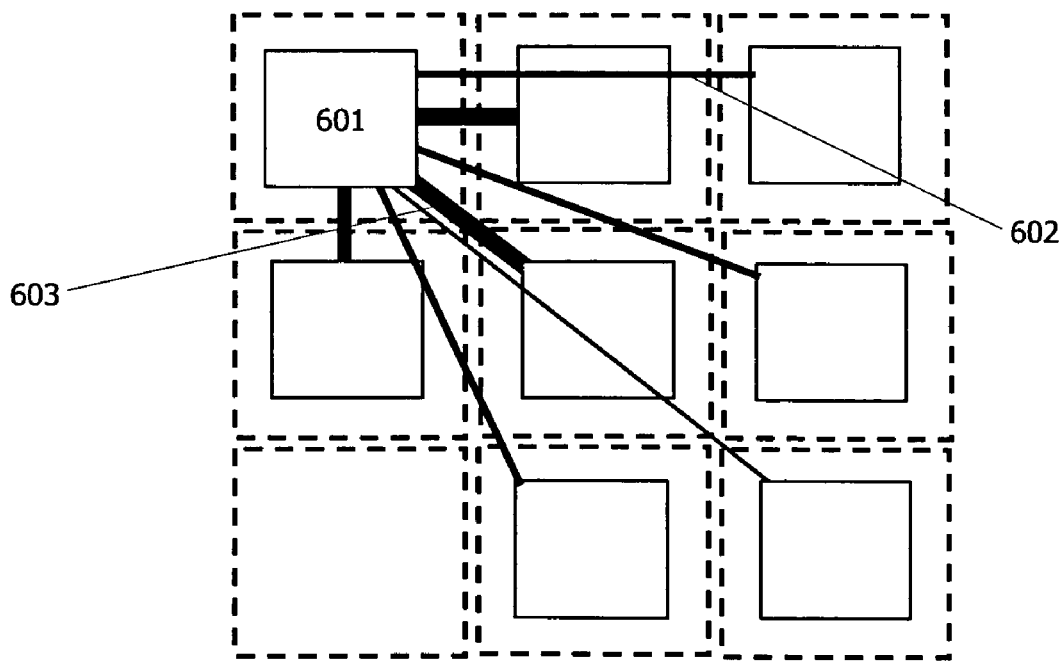
FIG. 6 shows how individual functional units may be placed based on the level of communication they have with other units in the processor.

FIG. 6 illustrates the effect of the unit placement. Consider that the unit 601 is being placed into the array and that position is a candidate for its final placement. The placement is good as the majority of communication is with neighbour units. A communication with a low frequency 602 is with a non-adjacent unit. A more frequent communication path 603 is with a neighbour unit. The placement seeks to minimise the weighted sum of communication costs with other units.

Key Connectivity Addition (Step 309)

This phase adds connections between spatially local units in the virtual array. This forms the basis of the minimum connectivity network for the processor. All units are able to copy operands so if a value is available at any unit in the array it can be transported to any other.

The units are visited in the same order that they were placed in the array (the ordering is stored). A connection may be added for each North-East-South-West (NESW) neighbour of the unit. The number of neighbours will vary between 1 and 4 depending upon the unit. The sides are visited in order of distance from the central unit so that those connections (i.e. connections to the centre of the array) are given priority. If a neighbour connection already exists then an additional one is not added. For each unconnected neighbour the most appropriate operand or result port is selected. Multiple connections to particular result ports or operands are not made unless absolutely required (i.e. if a unit only has one operand and result but four neighbours).

Neighbourhood links are the width of the ports involved. The arrangement of the units ensures that data values of sufficient width can be passed around the network. If a result port is wider than the operand port it is connected to then superfluous bits are unconnected. If the operand port is wider than the result port then either sign or unsigned extension logic is added depending upon the type of the operand.

Figure 7:
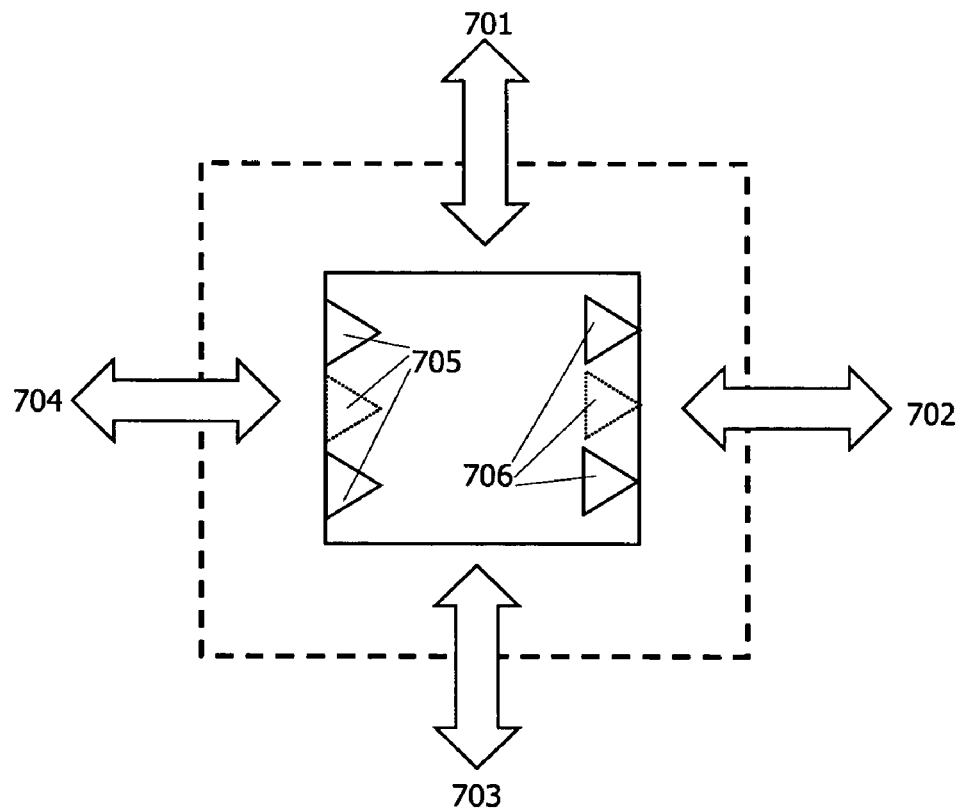
FIG. 7 shows a representation of how functional units are orientated to their neighbours in the two-dimensional grid.

The possible neighbour connections that may be made to a unit are illustrated in FIG. 7. A functional unit has a number of input operands 705 and output results 706. These may be connected to neighbours North 701, East 702, South 703 and West 704. The fitness of the connection is formed on the basis of the weighted sum of communications likely to be flowing in that direction based on the quantative data flow.

Reachability Closure (Step 310)

This phase adds additional connections as required to ensure that any result from any unit can be passed to any operand of any unit. The connections added during the previous phase will provide most of the connectivity required to achieve this. The levels of data flow direct the connections added during that phase. They do not guarantee full reachability. There may be areas of the array that form islands that are not connected to other areas. Moreover, there may be operands and result ports that remain unconnected.

A data structure may be created with an entry for each unit in the array. Each operand and result port for the unit has an associated flag. For an operand port that flag is set to true if data can be passed to the operand port from the first result port of the origin unit (the unit in the centre of the virtual array). For a result port that flag is set to true if data from it can be passed to the first operand of the origin unit. These flags are used to determine if the array is fully reachable. All flags are set to true in that case.

The analysis starts with the origin unit and the physical neighbour connections are traversed to set the flags appropriately. Flows into the origin are followed backwards for the result flags and flow out of the origin are followed for the operand flags. The resulting flags represent the initial origin reachability of the units. The reachability analysis maintains the minimum width connection that has been passed through. Units with operands of greater widths are not considered to be reachable even if connections exist since some of the upper bits of a data value will have been lost.

The reachability analysis does not allow the flow of data through units that already have one or more operands considered to be reachable. All operands must be reachable using routes not requiring use of other operands to a unit. This ensures that it is possible to route all operands to a unit one-by-one and hold them in the connecting bus as live until the unit is triggered. There may also be certain other operands that are exempt from the reachability copy flow because they are required to be live for certain code generation sequences.

The first placed unit for which all flags are not set is adapted. A new connection is added to the first unreachable port to a neighbour unit that is reachable. If no neighbours are reachable then another unit is tried. At least one unit must a reachable neighbour. Each result flag also has an attribute of the number of bits width that are actually reachable so that suitable connections are made. Once the connection is added the analysis is extended to determine which units are now reachable. This process continues until all ports are reachable. This also ensures that all operand and result ports are connected.

The reachability analysis may include a maximum hop distance (not taking account of unit latencies) to provide a ceiling to communication times. This could be set to maximum length of a side of the virtual array rectangle.

Figure 8:
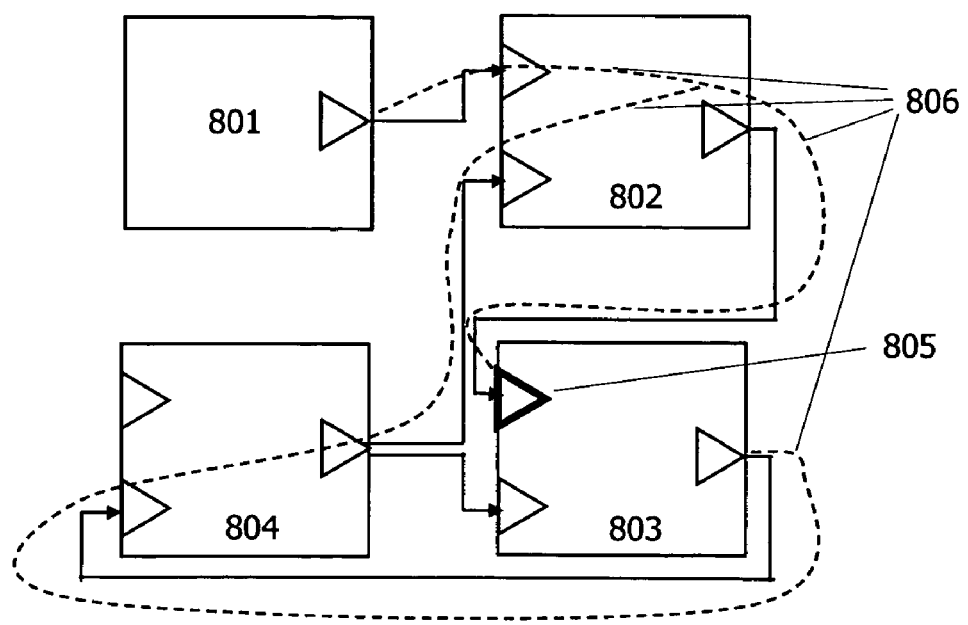
FIG. 8 shows a step in the process of testing for communication reachability within the processor architecture.

FIG. 8 shows an example of reachability closure analysis for a particular operand 805. The array consists of the functional units 801, 802, 803 and 804. The lines 806 show the paths that are examined to prove the reachability of the operand from all possible result ports. In this case the operand is fully reachable.

A number of connections to particular operands on particular units are exempt from usage for transporting data items when determining reachability closure. This is because these operands are required to hold live values across the usage of other operations.

Execution Word Optimisation (Step 311)

This step generates the execution word layout for the processor. The execution word width is a fixed input parameter to the optimisation process. The execution word has to be updated after the addition of each new connection has the addition of a new connection may increase the width of a selection field for a particular functional unit. Thus the layout needs to be updated. The layout optimisation uses the frequency of unit use information gathered as part of the code mapping process.

Fitness Measurement (Step 312)

This step measures the fitness of the candidate architecture in terms of its efficiency at executing the code from the source program. One possible way of achieving this is by mapping and scheduling the code onto the architecture. The fitness may then be measured via estimating the execution time of the scheduled code.

New Connection Addition (Step 314)

The choice of new connections is driven by the transport optimisation phase of the fitness measurement. This generates a connectivity request matrix for the whole software application. The requested connection with the highest weight that can be added is included into the system. There are a number of restrictions on the addition of new connections. Firstly, there is a maximum input multiplexer selection number and a maximum number of output connections from a unit. These are parameterised as part of a functional unit library definition so that a fixed target operating frequency can be achieved. If a particular unit has less timing slack the the choice of connections is made more limited. Secondly, there is a restriction on the distance of a connection in the array. Only connections between neighbour and near neighbour units are permitted. The extent of this area can be parameterised as part of the library definition.

New Unit Addition (Step 315)

The new unit addition is the final step in the architectural optimisation process. It is performed when the addition of new connections to a base architecture has been exhausted. A particular type of unit is selected and an additional functional unit of that type is made available in the architecture. The choice of the unit type is based on statistics gathered during the fitness measurement process showing the most frequently used units that can be replicated (memory units, register file units, I/O and some other types of units cannot be replicated). The usage count of a unit includes the copy operations required to copy data into and out of the unit. Thus if performance can be increased by adding more units so that they are likely to be more locally available then this is appropriately reflected in the usage count.

Architectural Synthesis Example

This section provides an example of architectural synthesis and code generation. A base architecture is generated with the required execution units. The architecture is then optimised using a performance critical loop of code. Custom connections are added and the impact on the resultant code schedule is shown. The final customized architecture along with the code schedule for the performance critical loop is shown at the end of the example.

This example should help with a general understanding of how the process works in practice and the function of the individual steps.

Source of Program

FIG. 9 shows the source code for the code that is going to be used as the example. The code shows a 16-tap Finite Impulse Response (FIR) filter coded in the C language. This type of digital filter is very common and used in wide range of applications. The central loop multiplies a sample with a coefficient and keeps a cumulative total for the results with all coefficients.

The source has been coded to minimise the number of instructions generated in the loop body itself. The same efficiency can be obtained with a less optimally coded example by using compiler optimisations. The hand optimised version is shown to simplify the task of matching the source code against the machine code generated by the compiler.

The example is compiled using a standard RISC compiler. In this example the source was compiled using the ARM software development suite C compiler.

Region Extraction (Step 301)

FIG. 10 shows the short sequence of code forming the main loop of the filter. This sequence of ARM instructions will be used as the example code for the rest of this example. Instruction 1001 loads a sample from memory and increments the pointer. Instruction 1002 loads a coefficient from memory and increments the pointer. Instruction 1003 checks a pointer value against the loop end Instruction 1004 performs a multiply of the coefficient and sample and then accumulates the result. Instruction 1005 branches back to the start of the loop while there are still coefficient/sample pairs to be processed.

The control flow analysis identifies the branch to the INNER_LOOP has a backward branch. This allows the sequence of code to be processed as a loop and, as such, the code is allocated to a separate region.

Code Translation (Step 303)

Figure 11:
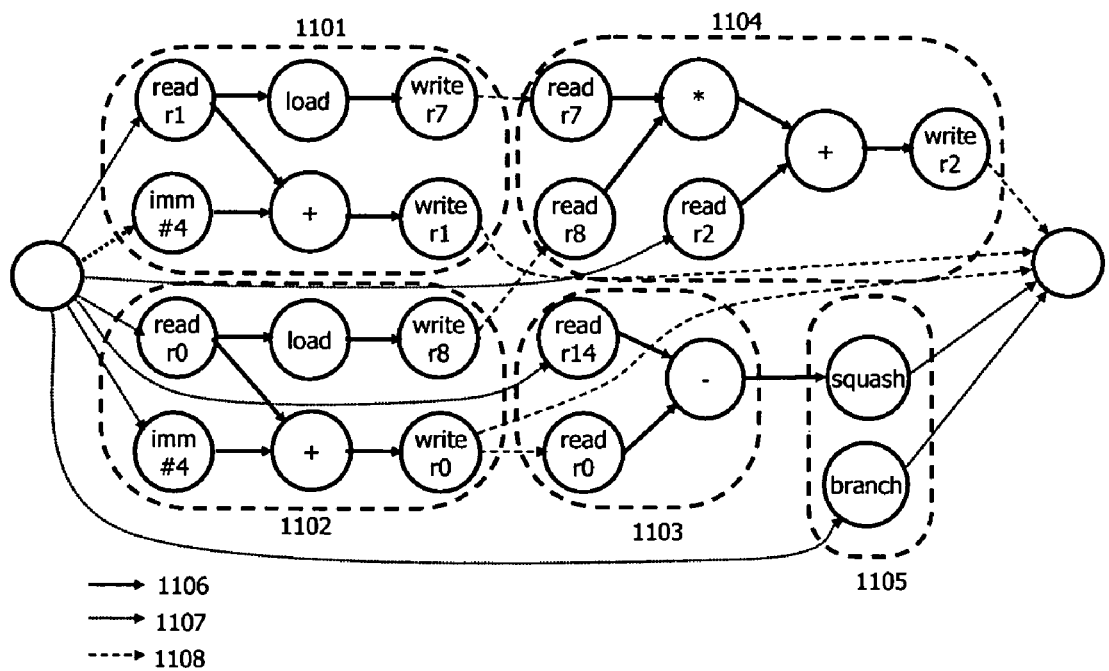
FIG. 11 shows an initial graph representation of the machine code given in FIG. 10.

FIG. 11 shows the translation of the ARM code into a CDFG representing the base operations to be performed to implement the filter. The translated code will produce the same register results on an ARM instruction granularity basis. The key shows data arcs 1106, control arcs 1107 and tunnel arcs 1108 in the CDFG.

Area 1101 represents the segment of the CDFG associated with the sample load 1001. Area 1102 represents the segment associated with the coefficient loading 1002. The load instructions generate six independent operations due to the use of the complex addressing mode. The base register is read, the access performed and the loaded data written to the appropriate destination register. An immediate value of 4 is loaded and added to the base register and the base register updated in the register file in order to perform the address increment Area 1104 represents the segment associated with the multiply-accumulate 1004. The MLA (multiply and accumulate) is also translated into five individual operations. The source registers are read and the multiply performed. The accumulator register is then read, the multiply results added to it and then the new total written back to the register.

Area 1103 represents the area associated with the comparison 1003. The compare instruction is translated into three operations. The two operands are read from the register file and a subtraction performed. The same execution unit (arithmetic) is used for both addition and subtraction but with a different method selection.

Area 1105 represents the area associated with the loop end branch 1005. The branch is implemented by a squash and branch operation. The squash operation reads the carry output from the arithmetic unit performing the comparison. The squash is used to control the execution of the branch operation. The branch operation does not require an immediate operand as the branch is to the start of the current region. That address can be simply selected by using a particular branch method.

Idealised CDFG Construction (Step 305)

Figure 12:
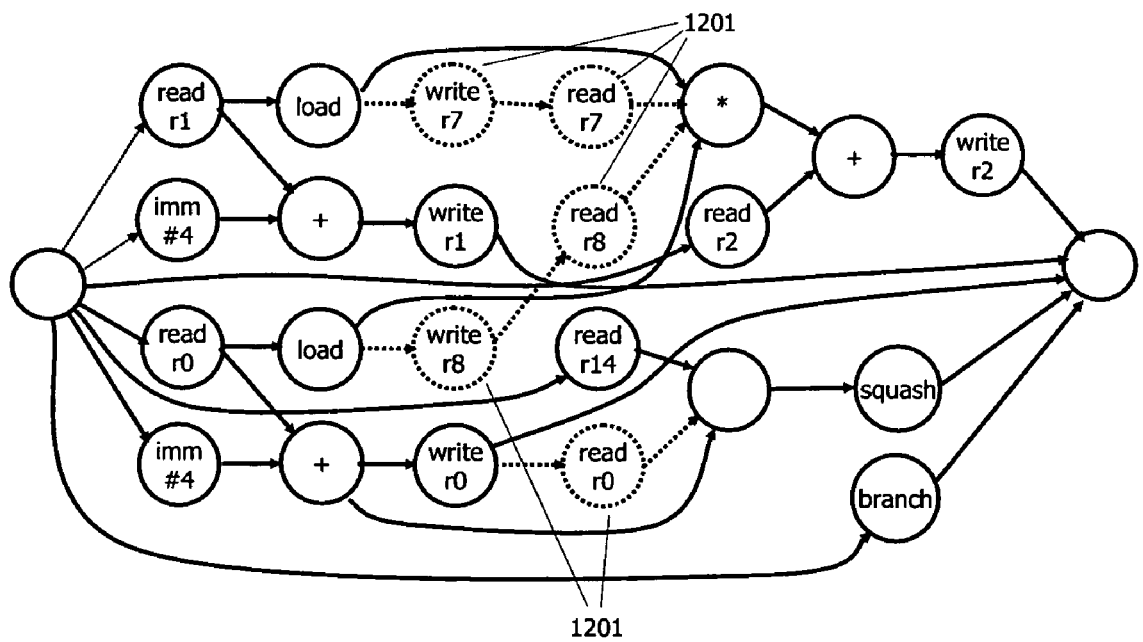
FIG. 12 shows an optimised version of the graph for the machine from FIG. 10.

Once the CDFG for the loop has been built it is optimised in order to remove unnecessary operations. The optimisations applied to the example CDFG are shown in FIG. 12.

The optimisations are focused on improving the transport of particular data items between operations. This is done by eliminating register reads and writes 1201 so that data items can flow directly between operations without go through the register file, wherever possible.

Three applications of register bypassing are applied. Firstly, the write and read of register R7 (one of the parameters to the multiply) can be optimised away as R7 is not live at the end of the loop. Thus data can flow directly from the memory unit to the multiply unit. Secondly, the other operand in R8 to the multiply is similarly optimised. Thirdly, the read of R0 to obtain the current address for comparison can be optimised away. In this case the corresponding write of R0 is retained as the register is live as a loop carried register.

Quantative Data Flow (Step 306)

The unit placement in the virtual array seeks to place units that communicate frequently dose to one another. This means that there is a higher likelihood that they can be connected using direct physical connections. Neighbour units can be allocated direct connections. If the units have to be communicate indirectly then if they are physically dose then that minimises the number of intermediate steps required to communicate operands. This reduces the latency of operations.

Figures 15, 16:
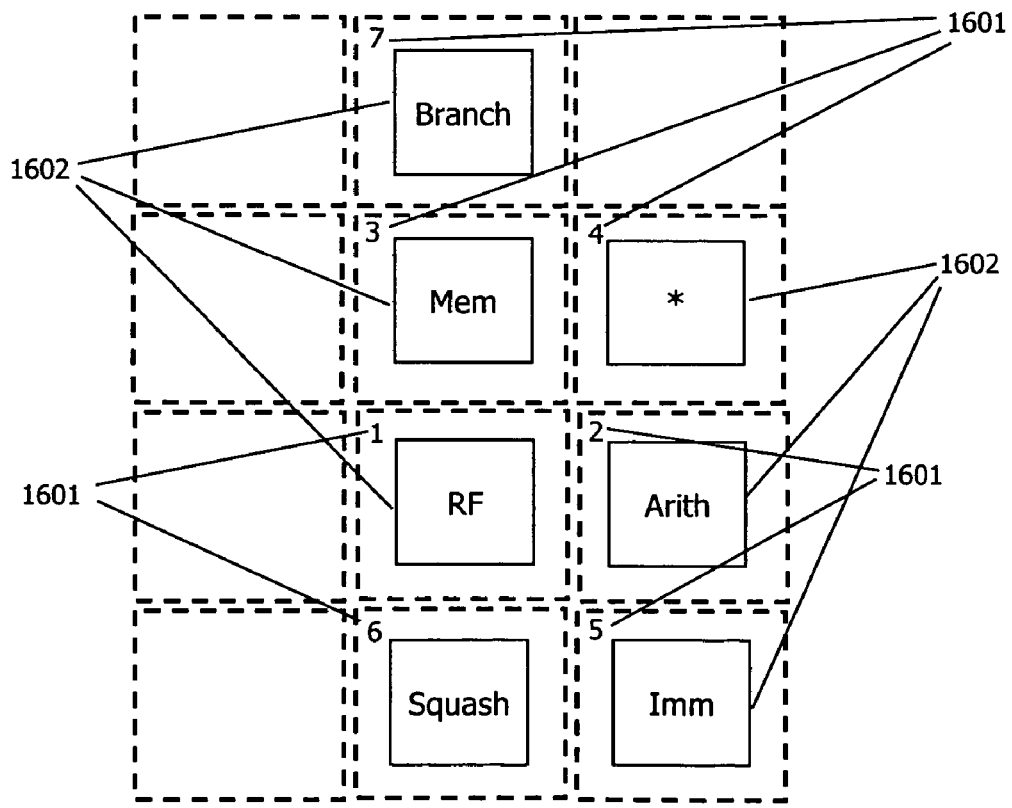
FIG. 15 shows a table of example communication between particular functional unit operands and results.
FIG. 16 shows the grid after the placement of the functional units in the example.

To direct the unit placement process a matrix is built up representing the data flow within the application. An example matrix is shown in FIG. 15. The rows of the matrix represent the input operands of each of the functional units in the system. The columns represent the output results of the functional units. The values in the matrix indicate the number of transfers that are made from a particular output port to a particular input operand. Thus the quantity of data flow between them is represented. The amount of data flow is also weighted by the relative priority of the functions in which the communications occur. Thus important loop kernels have a much higher impact on the values in the matrix than infrequently executed control code.

The values in the matrix are obtained from an idealised representation of the CDFG. In that representation all possible transport optimisations are performed, assuming that all Functional Units can communicate with each other directly. The results represent the transfer of data between actual operations rather than with the register file, in so far as is possible.

Unit Placement (Step 308)

Figure 14:
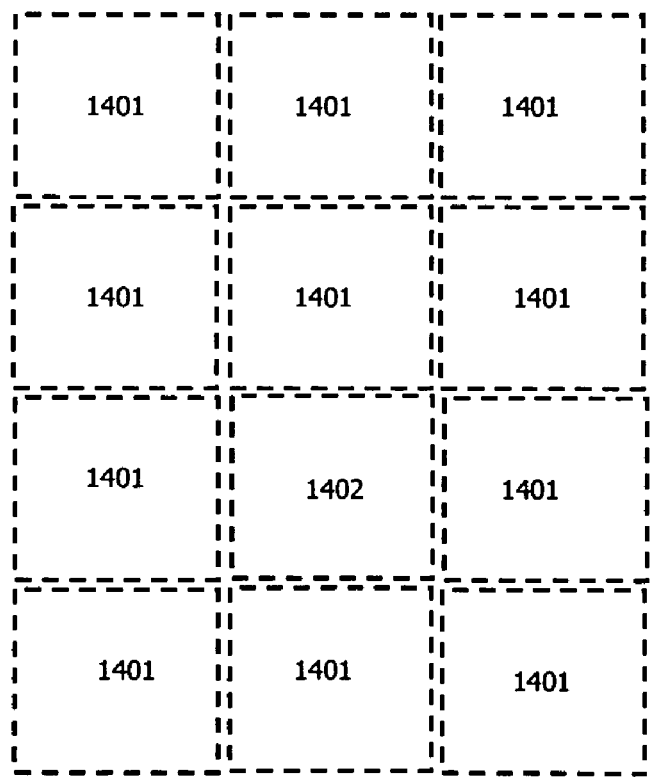
FIG. 14 shows the empty layout grid prior to the placement of functional units.

The architectural synthesis must allocate the functional units into a grid configuration. Before the allocation commences there is effectively an infinite virtual grid into which the units may be allocated. This is illustrated in FIG. 14.

The origin position at the centre of the grid is always allocated with the register file unit 1402. This unit is always placed centrally because it is likely to require the high levels of communication with the other functional units. Its central placement minimises its average distance to all other functional units in the system. The other unallocated positions 1401 may be allocated to any unit type.

Figure 13:
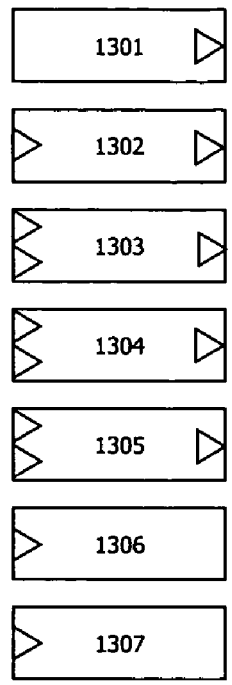
FIG. 13 shows a set of functional units that may be used to implement the FIR example.

FIG. 13 shows the set of execution units that are required to execute the main loop of the filter. There is an immediate unit 1301, a register file unit 1302, a memory unit 1303, a multiplier unit 1304, an arithmetic unit 1305, a squash unit 1306 and a branch unit 1307. In a complete implementation some other execution units are required (such as a logical unit) to enable the translation of all instructions in the host instruction set. However, for the sake of simplicity only those units required for the example are shown.

The units are placed so that units with high levels of inter-communication are placed as dose to one another as is possible. An example is shown in the FIG. 16. The functional units 1602 are shown placed in the array. The order in which the units may be placed is shown 1602.

As discussed previously the register file is always placed first. From that point further placements are made by selecting units in reducing order of their frequency of usage. Thus units that are used very frequently are placed near the centre of the array. This allows improved communication with other important units such as the register file.

After the register file unit is added the arithmetic unit may be placed next due to its high level of usage in the example. It is placed adjacently to the register file. The memory unit may then be placed due to its high usage in the loop. Placement continues until all units have been allocated to the array.

Key Local Connectivity (Step 309)

Once all the individual functional units have been placed connections must be generated between them so that they can communicate. There are rules governing the creation of connections in the system. They can only be made between adjacent or otherwise physically dose units. This prevents connections being synthesised that are long and thus take up significant area or introduce significant delays to the timing of the system.

Figure 17:
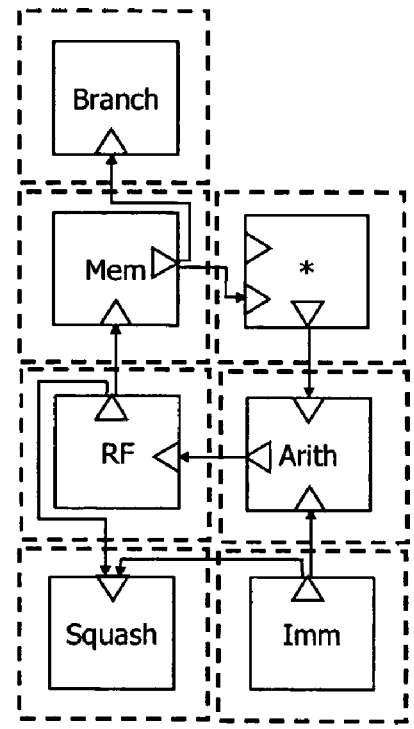
FIG. 17 shows the processor functional units after the main structural data connections have been made.

The diagram below shows the initial neighbour connections that have been made in FIG. 17. In this example, connections are made between all North, South, East or West neighbours in the array. The quantative data flow is used to drive decisions about the neighbour data connections that should be added.

For instance, the register file input is fed from the output of the arithmetic unit since that is the most frequent source of data that needs to be written to the register file. The output of the register file is fed to the address input of the memory unit. Again, this is because it is frequent data flow. In the case of the register file unit it has only one input and one output but it has three neighbours. Thus one of the input operands or output ports has to be utilised twice in order to generate the required connections. In this case the output connection is also made to the input of the squash unit. This allocation of connections between neighbours continues until all required connections have been made.

Both the orginal placement of the units and the choice of initial neighbour connections is based on inter-unit communication. Thus many of the connections created should represent some of the key data flows with the application.

Reachability Analysis (Step 310)

Once the initial connections have been made the network of communication paths are examined and additional connections added as required to ensure reachability. Reachability means that a result from any port of any functional unit can be fed to any operand port of any other functional unit. Thus code can be mapped to any combination of functional units in the system and data can be passed between them as required for any possible sequence. Obviously most of the paths will be highly indirect requiring the data operands to be copied via functional units a number of times before the final destination is reached. Thus the efficiency of the code is highly dependent upon the exact functional units chosen and the actual data flows required. The placement of units and connections created between them is focused on making those paths efficient.

Figure 18:
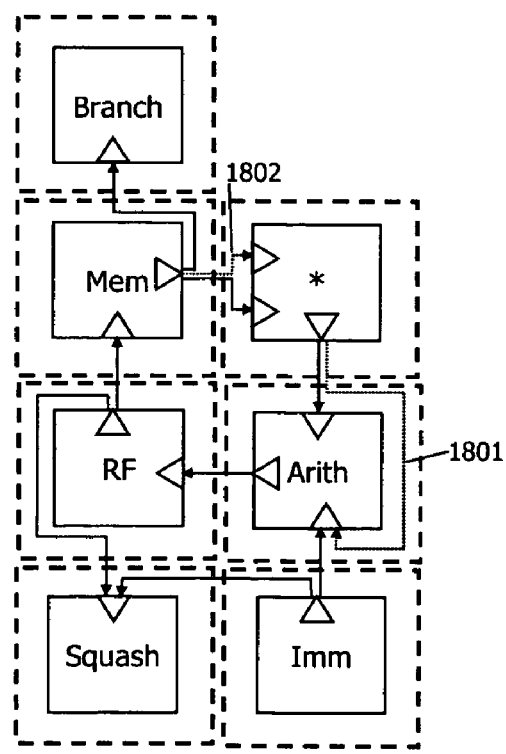
FIG. 18 shows the processor functional units after additional connections have been added to ensure reachability between the units.

The additional connections that need to be added for the reachability closure in the example are shown in FIG. 18.

The first operand of the multiplier unit 1802 was not previously connected to any result port and is thus not reachable from anywhere. A new connection is added to connect it to the output of the memory unit like the other operand to the multiplier. The second operand to the arithmetic unit 1801 was previously only fed from the immediate unit. Since that unit has no inputs it provides no access to any other units within the system. Thus an additional connection must be added to the output of the multiplier unit. This allows results to be fed from all the other result ports in the system.

Once the reachability analysis is complete the array of functional units is fully connected such that data can be passed throughout the array. Additional constraints may also be imposed such that the number of intermediate copies to pass a particular data item from one result port to a particular operand is limited.

Fitness Measurement (Step 312)

Figure 19:
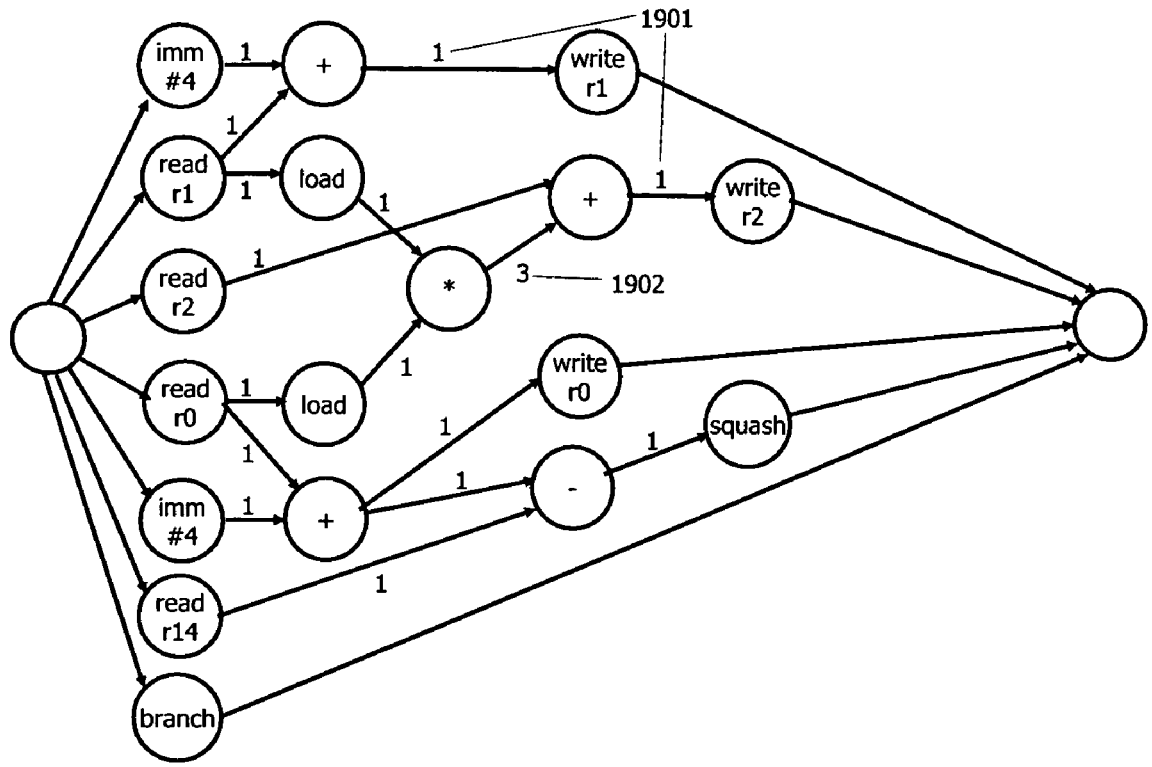
FIG. 19 shows the graph of machine operations annotated with their latencies.

The next stage is to label the arcs in the CDFG with the latency of the operations. This is illustrated in FIG. 19. The latency 1901 is shown alongside the arcs in the graph. In this case all operations have a latency of 1, except for the multiply which has a latency 1902 of 3.

The cost labeling is used during the node criticality analysis to determine the most critical nodes in the CDFG. These are the nodes that are in critical paths of data flow and whose placement in the schedule is likely to have the most impact on overall execution time.

Figure 20:
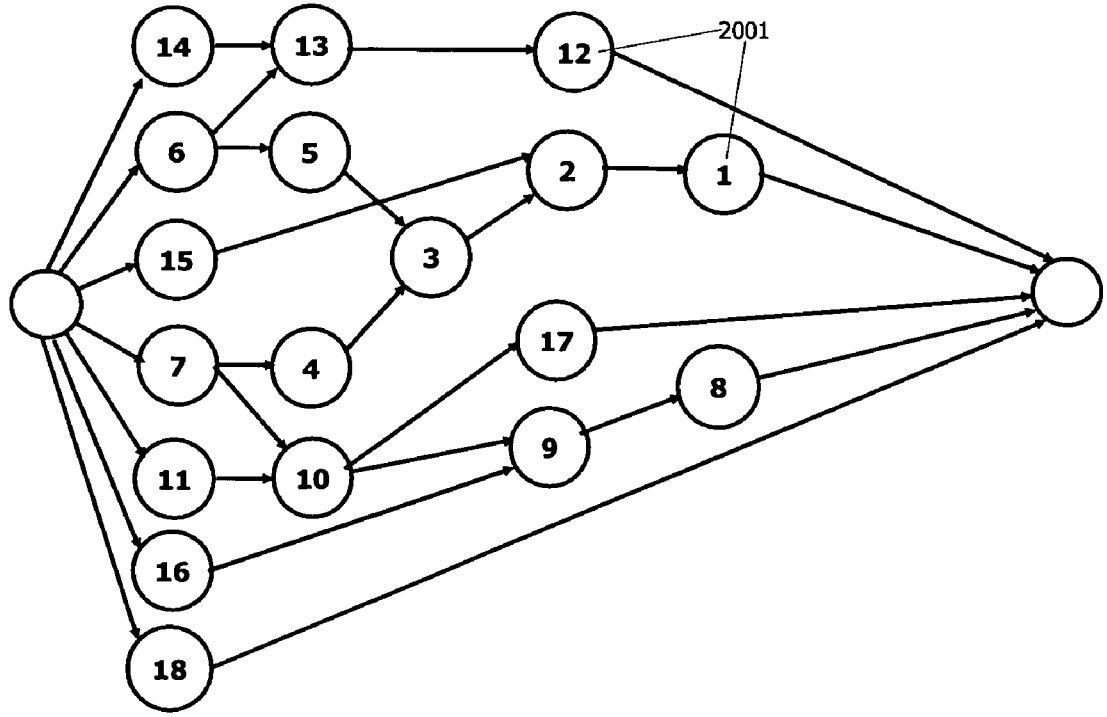
FIG. 20 shows the graph with the nodes ordered by their priority.

Once the arc labeling is completed, node criticality analysis is performed. A possible result for this example is shown in FIG. 20. The node criticality 2001 is shown within each node of the graph.

Each node is marked with a number indicating its criticality. Lower numbers are more critical than higher numbers. When performing scheduling, nodes with lower numbers are scheduled before nodes with higher numbers. This allows more critical nodes to be scheduled earlier and thus getting a better choice of placement in the code. A node can only be scheduled when all its dependent nodes have already been scheduled so these provide a further limitation in scheduling order.

The numbers are derived from the node free float calculated as part of the critical path analysis. The free float is a measure of how much the placement of node in the schedule can be varied without affecting the overall execution time of the region. Highly critical nodes on the critical data flow path have a free float of 0.

Figure 21:
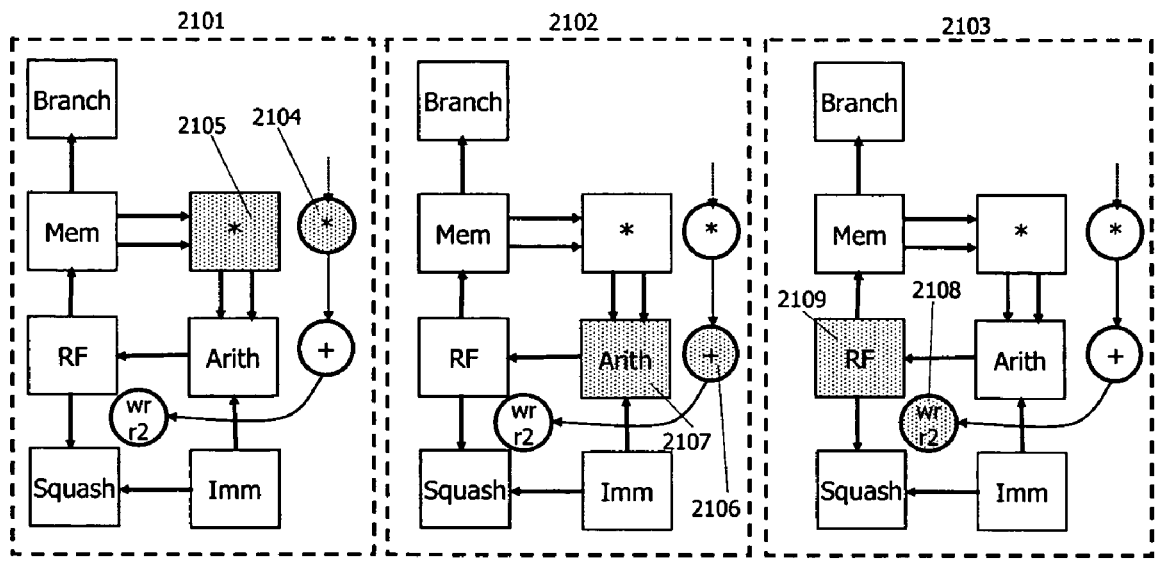
FIG. 21 shows an example of mapping operations from the graph representation until the hardware functional units.

The next step is the scheduling problem of mapping the CDFG to the architecture of the processor. A small segment of the CDFG is shown alongside the physical architecture in FIG. 21. At dock N 2101 the multiply operation 2104 is mapped onto the multiply unit 2105. As the multiply has a latency of 3 dock cycles the next operation cannot be initiated until dock cycle N+3 shown as 2102. At this point the add operation 2106 is performed on the arithmetic unit 2107. Since data can be fed directly from the multiplier to the arithmetic unit no intermediate copy operations are required and the two calculations can be executed back-to-back. Finally at dock cycle N+4 shown as 2103 the register write 2108 is performed on the register file unit 2109. Again the units are directly connected so no additional copy operations are required.

Figure 22:
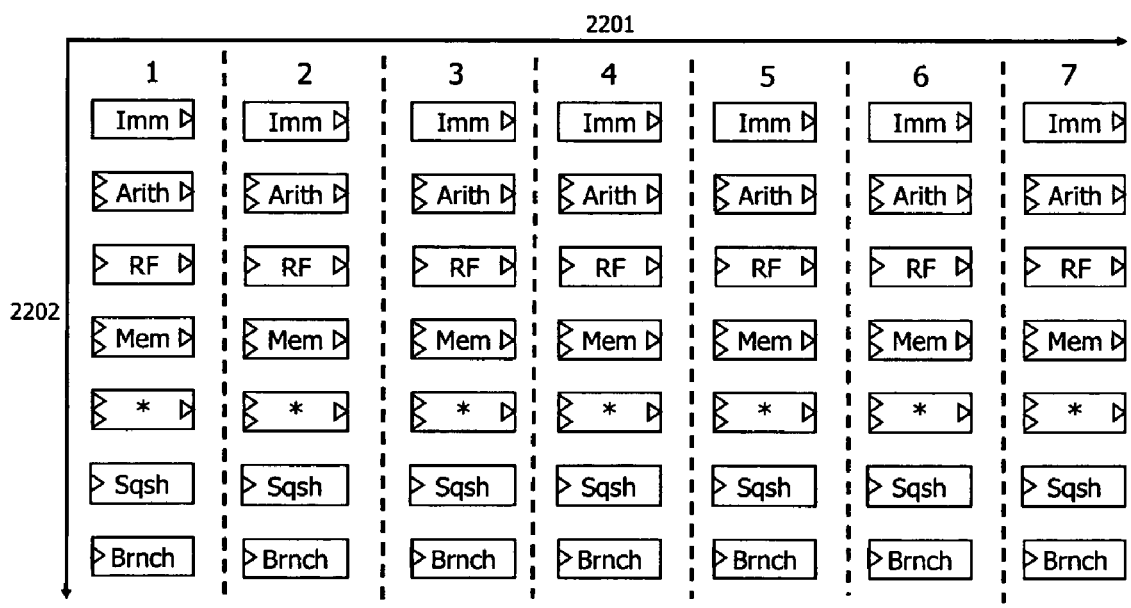
FIG. 22 shows a representation of a timeline for showing the flow of data through the functional units over time.

FIG. 22 shows an empty Unit-Time representation that can be used for scheduling on the example architecture. On each dock cycle shown on axis 2201 there is an entry for each functional unit in the processor. The axis 2202 shows the physical units available in the system. The table is used to show a graphical representation of how those units are used over time. The purpose of the scheduling process is to minimise the overall schedule length (i.e. total number of clock cycles to execute a given block of code) by making as much use of parallelism between functional units as possible.

Connectivity Optimisation (Step 314 and Iteration 317)

If the filter loop code is marked as being critical then it is used to customize the connectivity of the final architecture. Additional connections are added that correspond to data flows in the loop. Addition of these connections improves the performance that can be obtained. After the connections are added fitness is measured again. Multiple iterations are performed to add required new connections.

Figure 23:
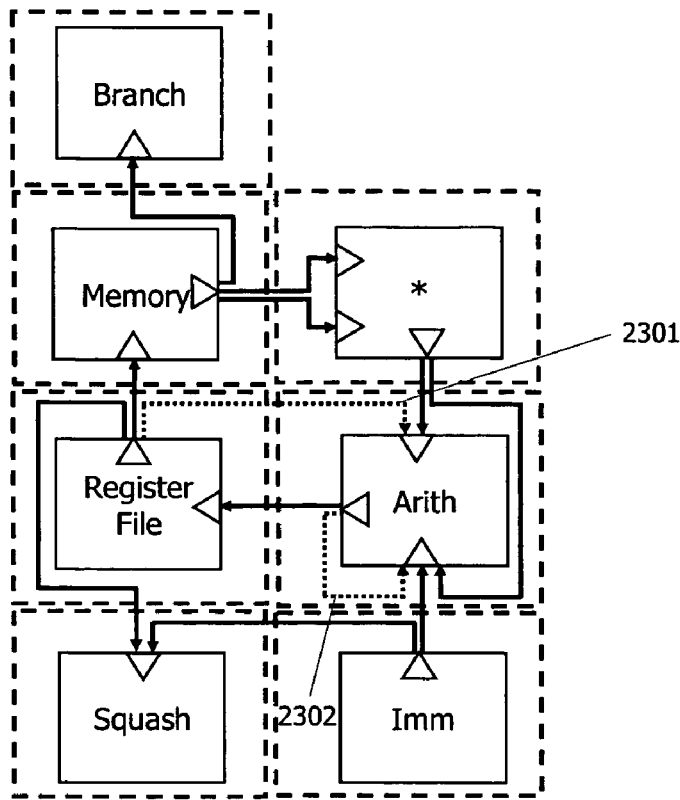
FIG. 23 shows the connectivity between the units once the architecture generation process has added key additional connections.

The first two custom connections that may be added by the example code are shown in FIG. 23. Firstly, a direct connection 2301 is made between the register file output and the first operand of the arithmetic unit. This allows the address registers to be read directly into the arithmetic unit in order for the addresses to be updated. A second direct connection 2302 is added between the output of the arithmetic unit back into its second operand. This allows cumulative results to be calculated without having to perform copy operations through other functional units. In effect this forms the accumulate section of a multiply-accumulate unit. The connections required for a multiply-accumulate unit emerge automatically in the architecture from analysis of the filter loop dataflow.

Final Schedule

Figure 24:
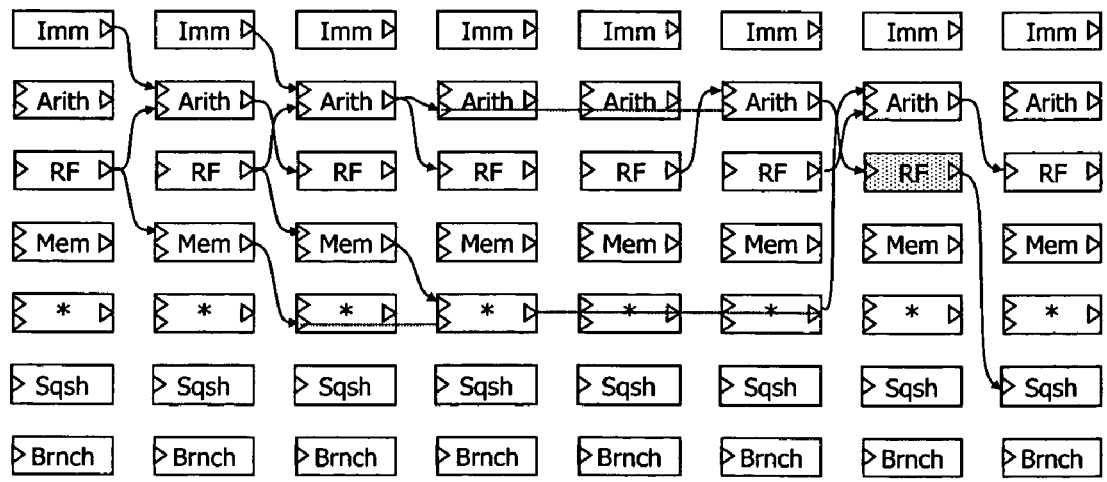
FIG. 24 shows a possible schedule for the example and the flow of data values through the functional units.

The impact of the custom connections on the schedule are shown in FIG. 24. The legends above the blocks of functional units show the set of operations being executed on each dock cycle. As illustrated a number of operations are completed on each dock cycle. The configuration of connections between the functional units (as configured by the measured data flows) ensures that the majority of data flows are directly from one unit to the next. In most cases the data arrives on exactly the dock cycle that it is required so that it is used immediately. One exception is the second operand to the multiplier where the data is available one dock cycle earlier than when it needs to be used. The multiply operation cannot start until the second operand is available. The data is simply held in the appropriate output register from the memory unit until it is required. Note that the result of the multiply is not read for three cycles after the operation starts as the multiply unit has a latency of that many dock cycles.

The shaded operation executed on the register file indicates a copy operation. The copy allows data to be passed from the arithmetic unit to the squash unit as these are not directly connected.

The register file unit is accessed on every single dock cycle. If more parallelism was available in the loop then the average number of register file accesses would tend to reduce, thus relieving pressure on that unit.

The customized data paths allow the entire loop to fit into 8 clock cycles. Higher average performance is possible with a loop containing more parallelism. However, such a loop would be too complex for a worked example.

SUMMARY

This example has illustrated how a specialised architecture is automatically generated using the data flow in example code to direct the connectivity. The architecture is optimised for execution of a FIR loop. However, many of the connections that have been added to the architecture will be commonly used by other, unrelated, code and provide significant performance benefits. A direct connection is automatically generated between the output of the arithmetic unit and one of its inputs to form an accumulate unit. The arithmetic unit is also placed next to the multiply unit so that results can flow directly into one of its operands. In effect, a custom multiply-accumulate unit has emerged from the optimisation.

The example used consists of only five host instructions. Therefore the amount of parallelism available is minimal. With a larger example much more parallelism is available and thus there is more scope to use many more of the functional units simultaneously.

More parallelism can be obtained from the FIR filter by unrolling the loop by hand so that each iteration performs a number of multiply-additions. The CDFG optimisation will be able to eliminate more register file accesses as a higher proportion will be to registers that are not live outside of the loop and are not loop carried.

In the preferred embodiment, the architectural synthesis tool may also be capable of performing loop unrolling. This was not shown for this example for the sake of brevity. However, the example loop would be unrolled to increase the number of operations in the loop and thus potential parallelism. Once unrolled a multiply could be initiated on every other cycle. The performance bottleneck is the need to obtain two data items from memory for each calculation. The code could be rewritten to model a second memory unit. The operands can then be obtained from different memory units and allow a performance of one multiply-accumulate per cycle to be achieved. With further memory units added the performance can be enhanced even further.

It is understood that there are many possible alternative embodiments of the invention. It is recognized that the description contained herein is only one possible embodiment. This should not be taken as a limitation of the scope of the invention. The scope should be defined by the claims and we therefore assert as our invention all that comes within the scope and spirit of those claims.

The invention claimed is:

1. A method of designing a microprocessor architecture whereby:
   the architecture includes a number of execution units;
   the architecture has configurable direct connectivity between said execution units; and
   the execution units are able to communicate data directly without the need to be connected between intermediate register files that are shared between said execution units; and whereby:
   data and control flows within a particular input program are automatically analyzed during the design of the microprocessor architecture and results of the analysis are used to create a hardware description of the microprocessor architecture that is synthesizable into a physical hardware embodiment of said microprocessor architecture.

2. The method according to claim 1 whereby the step of creating a hardware description of the microprocessor architecture includes the generation of one or more candidate architectures.

3. The method according to claim 2 whereby a final microprocessor architecture is automatically selected from said one or more candidate architectures on the basis of user defined metrics, thereby completing the design of said microprocessor architecture.

4. The method according to claim 2 whereby data is output to allow the construction of a graph representing characteristics of certain of said one or more candidate architectures.

5. The method according to claim 2 whereby said hardware description of the microprocessor architecture includes descriptions of connections between and numbers of execution units comprising said microprocessor architecture, and whereby a number of new connections and or execution units are added to the hardware description of said microprocessor architecture on each generation of a candidate architecture.

6. The method according to claim 5 whereby mapping of code onto a trial architecture is used to influence connectivity choices.

7. The method according to claim 6 whereby the delays caused by execution unit conflicts increase the chances of an additional execution unit being added to the microprocessor architecture.

8. The method according to claim 1 whereby every candidate architecture generated contains a certain minimum set of execution unit types.

9. The method according to claim 8 whereby there is a certain minimum connectivity between all execution units.

10. The method according to claim 9 whereby the minimum connectivity guarantees that arbitrary new code sequences can be mapped to the microprocessor architecture.

11. The method according to claim 10 whereby the guarantee of mapping of new code is performed using a reachability analysis between results and operands within the microprocessor architecture.

12. The method according to claim 11 whereby the reachability analysis ensures that result output from 4 every type of execution unit can be transported to the operand of every type of execution unit.

13. The method according to claim 11 whereby the reachability analysis ensures that every result can be written to a central register file and that every operand can be read from a central register file.

14. The method according to claim 1 whereby an initial connectivity within the architecture is determined from data flows within graph representations of the input program.

15. The method according to claim 5 whereby the new connections are added as a result of connections requested during the candidate-architecture generation process.

16. The method according to claim 15 whereby the addition of new connections is constrained by certain connectivity rules.

17. The method according to claim 16 whereby the connectivity rules relate to maximum numbers of operand inputs, maximum numbers of result outputs and an estimated connectivity distance.

18. The method according to claim 17 whereby a set of potential new connections are maintained and those which are added are those which will improve a fitness metric most but are within the constraints.

19. The method according to claim 1 whereby the execution units are placed in a logical grid layout.

20. The method according to claim 19 whereby the connectivity rules include a maximum distance between execution unit grid positions.

21. The method according to claim 19 whereby the execution units are obtained from a component library, each of which includes a reference to the hardware description of the execution unit.

22. The method according to claim 21 whereby the execution unit components have pre-characterised characteristics that include one or more of area, maximum operational frequency and average power consumption.

23. The method according to claim 22 whereby each architecture is designed to have a minimum operational frequency on a given implementation technology.

24. The method according to claim 19 whereby the placement of execution units is initiated with the register file at the centre of the grid.

25. The method according to claim 24 whereby the placement of execution units is performed from the centre outward in order of decreasing usage frequency of the execution units.

26. The method according to claim 1 whereby the architecture is optimised for a certain set of functions that are specified to the system.

27. The method according to claim 1 whereby the number and type of execution units and their connectivity for a given architecture is stored in a description file.

28. The method according to claim 27 whereby the stored number and type of execution units and their connectivity for a given architecture includes details of the execution word layout used to control each of the execution units.

29. The method according to claim 28 whereby the stored number and type of execution units and their connectivity for a given architecture includes details of selection codes associated with operand inputs, output registers and execution unit operation codes.

30. The method according to claim 27 whereby a top level hardware description language file is generated from the stored number and type of execution units and their connectivity for a given architecture that instantiates connectivity and required execution units.

31. The method according to claim 30 whereby required package or library files are automatically generated to incorporate the hardware descriptions for all the required execution models for the purposes of hardware synthesis.

32. The method according to claim 31 whereby instruction level profiling information is used to influence weighting of individual instructions.

33. The method according to claim 32 whereby the weighting of individual instructions during scheduling is related to profile weighting.

34. A microprocessor automatically configured using a method as defined in claim 1.

35. A method of automatic configuration of a microprocessor architecture whereby:
(a) the architecture includes a configurable number of execution units;
(b) the architecture has configurable connectivity between those execution units;
(c) the execution units are able to communicate data directly without the need to be connected between register files that are shared between multiple execution units; and
(d) the data and control flows within a particular input program are used to influence decisions regarding execution unit replication and connectivity,
whereby multiple candidate architectures are generated;
whereby a number of new connections and or execution units are added to the architecture on each generation;
whereby mapping of code onto a trial architecture is used to influence connectivity choices; and
whereby the delays caused by execution unit conflicts in the schedule are used to increase the chances of an additional execution unit of that type being added to the architecture.

36. A method of automatic configuration of a microprocessor architecture whereby:
(a) the architecture includes a configurable number of execution units;
(b) the architecture has configurable connectivity between those execution units;
(c) the execution units are able to communicate data directly without the need to be connected between register files that are shared between multiple execution units; and
(d) the data and control flows within a particular input program are used to influence decisions regarding execution unit replication and connectivity;
whereby the execution units are placed in a logical grid layout; and
whereby the placement of execution units is initiated with the register file at the centre of the grid.

* * * * *